(12) United States Patent
Kawata

(10) Patent No.: US 6,392,269 B2
(45) Date of Patent: *May 21, 2002

(54) NON-VOLATILE SEMICONDUCTOR MEMORY AND MANUFACTURING METHOD THEREOF

(75) Inventor: Masato Kawata, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/311,733

(22) Filed: May 14, 1999

(30) Foreign Application Priority Data

May 18, 1998 (JP) ............................ 10-135590

(51) Int. Cl.⁷ .............................. H01L 29/72
(52) U.S. Cl. ................. 257/316; 257/333; 257/506; 257/510; 438/257; 438/279; 438/426; 438/439; 438/702
(58) Field of Search ................ 257/506, 316, 257/333, 510; 438/257, 279, 426, 439, 702

(56) References Cited

U.S. PATENT DOCUMENTS 6,034,393 A * 3/2000 Sakamoto et al. .......... 257/506

FOREIGN PATENT DOCUMENTS

| JP | 62128567 | 6/1987 |
|----|----------|--------|
| JP | 265175 | 3/1990 |
| JP | 6-112502 | 4/1994 |
| JP | 6-232374 | 8/1994 |
| JP | 6232374 | 8/1994 |
| JP | 951082 | 2/1997 |
| JP | 9-172152 | 6/1997 |

* cited by examiner

*Primary Examiner*—Edward Wojciechowicz
(74) *Attorney, Agent, or Firm*—Young & Thompson

(57) ABSTRACT

A non-volatile semiconductor memory manufacturing method, according to the present invention, is comprised of the process steps that follow. Device isolating layers are formed on predetermined places in a cell region. A layer of floating gate material is deposited next, all over the substrate. Either all the layer of floating electrode material, deposited on the device isolating layers or a part of it, is removed next, by etching, in order to form ditches. To fill the ditches, a first insulation layer is formed next, all over the cell region. A predetermined part of the first insulation layer is removed next, by etching, so the layer of floating electrode material is exposed. Thereafter, the ditches are filled in, on top of the device isolating oxide layers, with insulation layers. A second insulation layer is formed next, all over the cell region. Thereafter, electrode material layers and are deposited on the surface. The second insulation layer and the electrode material layers are all dry-etched, to form control electrodes in the cell region. Each part of the insulation layers is left on each of the device isolating oxide layers.

14 Claims, 4 Drawing Sheets

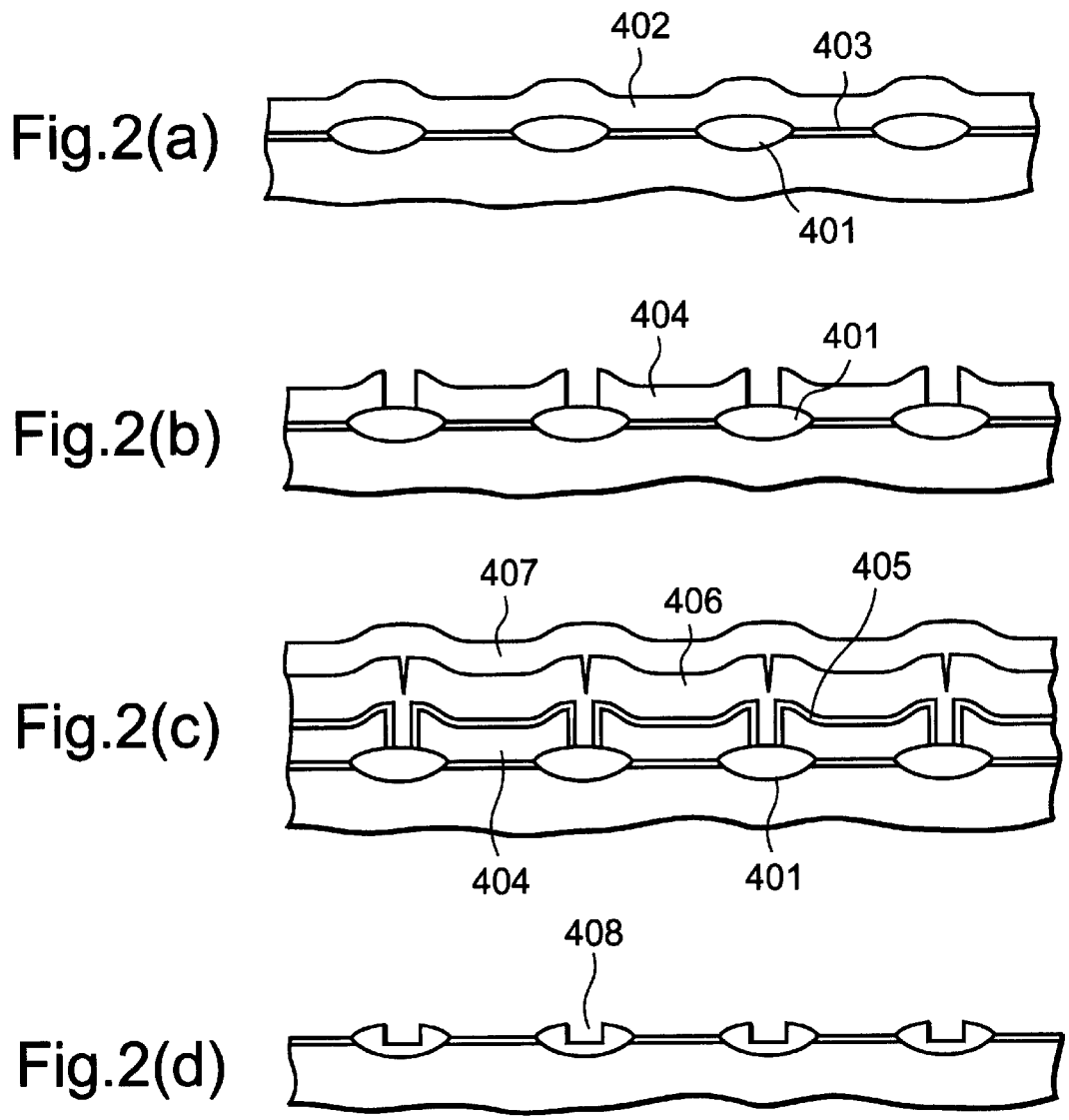

NON-VOLATILE SEMICONDUCTOR MEMORY AND MANUFACTURING METHOD THEREOF

BACKGROUND OF THE INVENTION

1. Field of the Invention

The present invention relates to a non-volatile semiconductor memory, with advanced, device isolating characteristics, which comprises the region of a peripheral circuit and a cell region, on a semiconductor substrate. It also relates to a manufacturing method for the non-volatile semiconductor memory.

2. Description of the Related Art

A conventional method of manufacturing a flash memory will be explained with reference to FIGS. 1 and 2.

FIG. 1 shows a configuration of the conventional flash memory, fabricated at the halfway manufacturing stage, just before the step of making an interconnection in a cell region of the flash memory. Source regions and drain regions are both formed in diffused layer regions 301. Floating gates 303 are formed in hatched regions. Word lines 304, which also play a role as control electrodes, are formed over the floating gates 303. Device isolating oxide regions 302 are formed in the regions between the adjacent left and right diffused layers 301. Tunnel oxides, each playing a role in the generation of a channel region, are formed right under the respective floating gates 303, but not in the device isolating oxide regions 302.

The conventional method of manufacturing the flash memory will be explained below, with reference to process cross-sections of FIGS. 2(a) to 2(d), along the line AA' in FIG. 1. A device isolating oxide layers 401, in FIG. 2, correspond to the device isolating oxide layers 302 in FIG. 1. Floating gates 404 in FIG. 2 correspond to the floating gates 303, in FIG. 1. In FIG. 2(b), the floating gates 404 extend to and exist on the device isolating oxide layers 401.

Firstly, referring to FIG. 2(a), the device isolating oxide layers 401, each having a thickness of approximately 400 to 500 nm, are formed on a semiconductor substrate by utilizing the LOCOS (Local Oxidation of Silicon) method, etc., followed by the formation of a tunnel oxide layer 403, each having a thickness of 10 nm or less, in a device region on the substrate of the flash memory. A polysilicon layer 402 is deposited next, all over the surface. Phosphorous (p), generally, is implanted next, in the polysilicon layer 402, which has a thickness of approximately 150 nm.

Next, a photo resist (not shown in figures) is patterned by using the conventional photographic process. Thereafter, floating gates 404 are formed by etching the polysilicon layer 402 (see FIG. 2(b)).

Thereafter, an insulation layer 405 is deposited all over the resulting surface of the semiconductor substrate to isolate control gates from the floating gates 404. The insulation layer 405 with an ordinary, multiple layered structure of a silicon oxide layer, a silicon nitride layer, and a silicon oxide layer, has a thickness of 18 nm, if it is converted into the thickness of an oxide layer. A polysilicon layer 406, which is implanted with phosphorous implant, and a silicide layer 407 are deposited next, in the order, all over the substrate (see FIG. 2(c)). Thickness of each of these layers is equal to approximately 150 nm.

Predetermined places in the cell region are covered next, by a resist (not shown in Figures) for etching purposes, so as to form cell gates (hereafter, referred to as "cell gate etching").

Cell gate etching is then performed. It is noted that no cell gate is formed in any region in the cross-section of FIG. 2(d), since the cross-section is along the line AA' in FIG. 1. In this etching step, the silicide layer 407 and the polysilicon layer 406 are both etched and removed in the order. The insulation layer 405 is then etched and removed. Wherein, to remove the insulation layer 405 completely, some extent of over-etching needs to be done. However, the etching selectivity of the insulation layer 405 to the device isolating oxide layer 401 cannot be set to a high value. This causes a partial loss of the device isolating oxide layer 401, forming concave portions 408 on the respective device isolating oxide layers 401, as shown in FIG. 2(d).

Thereafter, source regions and drain regions (not shown in Figures) are formed in the cell region, whereas gate regions are also formed in the region of the peripheral circuit. In the region of the peripheral circuit, source regions and drain regions in the transistors are formed. A flash memory is completed next, by subjecting it to an ordinary contact process and an ordinary interconnection process.

However, according to the conventional techniques as described above, there is the problem that concave portions 408 are formed in the device isolating oxide layers 401 of the cell region, due to the fact that the etching selectivity of the insulation layer 405 to the device isolating oxide layer 401, which is located under the insulation layer 405, cannot be set to a high value when the insulation layer 405, in the cell region, is etched (see FIG. 2(c)). This may cause a deterioration of the device isolating property. For example, an ion implant such as an arsenic implant or a phosphorous implant, which is used for the formation of source regions and drain regions, may pass through the concave portions 408 of the device isolating oxide layer, causing the generation of a channel right under each device isolating oxide layer.

SUMMARY OF THE INVENTION

Accordingly, the objective of the present invention is to provide a non-volatile semiconductor memory with advanced, device isolating characteristics and to provide its manufacturing method.

To attain the above objective, according to an aspect of the present invention, a non-volatile semiconductor memory is provided, comprising a plurality of device isolating layers, formed in a semiconductor substrate and a plurality of insulation layers, formed on the respective device isolating layers. An example of the configuration of the non-volatile semiconductor memory, according to the present invention, is illustrated in FIG. 4(e).

According to another aspect of the present invention, a non-volatile semiconductor memory manufacturing method is provided, comprising a first forming step, of forming a plurality of ditches on a layer of floating electrode material, which has been deposited over a plurality of device isolating layers on a substrate, and a second forming step, of forming a plurality of insulation layers, respectively in the plurality of ditches. An example of the process steps of manufacturing the non-volatile semiconductor memory are illustrated in FIGS. 4(a) to 4(c).

According to still another aspect of the present invention, the non-volatile semiconductor memory manufacturing method, further comprises a third forming step, of forming an insulation layer over the resulting surface from the second forming step, and an etching step of etching the insulation layers formed in the third step, the layer of floating electrode material, and the plurality of insulation layers, formed in the third step. An example of the additional process steps, as described above, is illustrated in FIGS. 4(d) and 4(e).

BRIEF DESCRIPTION OF DRAWINGS

The above and other objects, features and advantages the present invention, will become apparent from the following detailed description, in the embodiment section, when taken in conjunction with the accompanying drawings, wherein:

FIGS. 2(a) and 2(d) illustrate process cross-sections, showing the conventional method of manufacturing the a flash memory;

DETAILED DESCRIPTION OF THE PREFERRED EMBODIMENTS

Hereafter, a non-volatile semiconductor memory and its manufacturing method, according to the first embodiment of the present invention will be explained with reference to FIGS. 3(a) to (d) and FIGS. 4(a) to 4(e).

Figure 1:
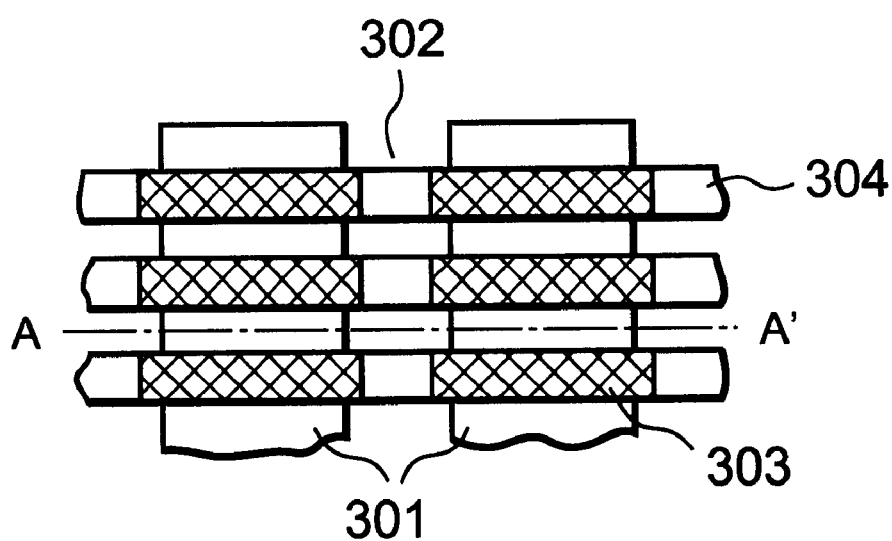
FIG. 1 illustrates an aerial view of the conventional flash memory.
Figure 3A:
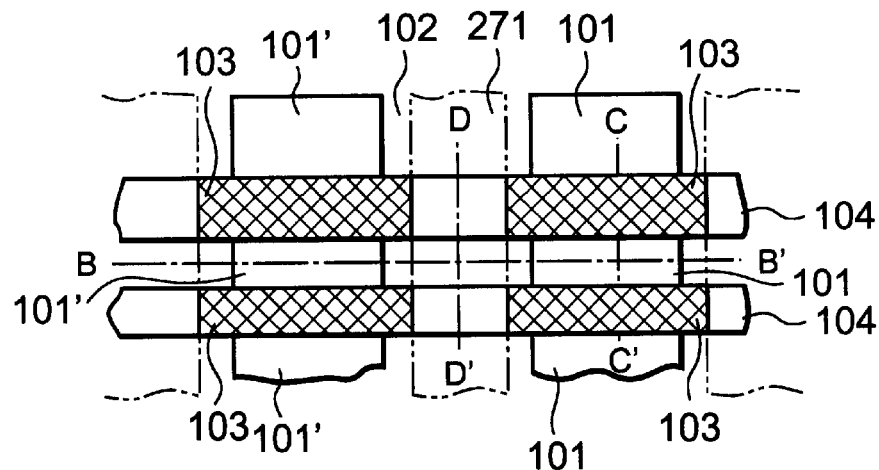
FIG. 3(a) and (d) illustrate views of a flash memory, according to the present invention.

FIG. 3(a) illustrates an aerial view of the non-volatile semiconductor memory according to the first embodiment of the present invention, which is at the halfway manufacturing stage, just before the step of making an interconnection in a cell region of the memory. Source regions and drain regions are formed in diffused layer regions 101. Floating gates 103 are formed in hatched regions in the figure. Word lines 104, which also play a role as control electrodes, are formed over the floating gates 103. Device isolating oxide regions 102 are formed in the region between the adjacent left and right diffused layer regions 101. Tunnel oxide layers, each playing a role in generating a channel region, are formed right under the floating gates 103, but not in the device isolating oxide regions 102.

Figure 3B:
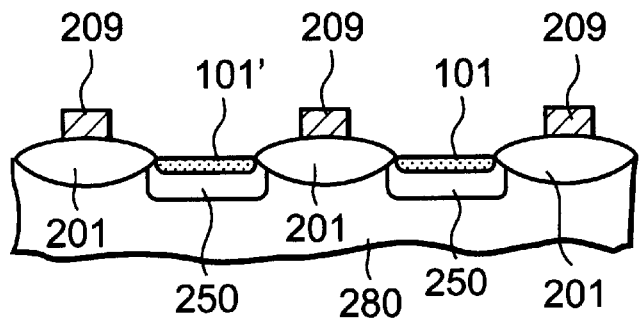

FIG. 3(b) illustrates a sectional view taking in a line BB' of FIG. 3(a). Device isolating oxide regions 201 corresponds to the regions 102. Well regions 250 are formed between the adjacent regions 101. Impurity regions 101 are formed in the respective well regions 250. Insulating layers 209 are formed on the respective regions 201.

Figure 3C:
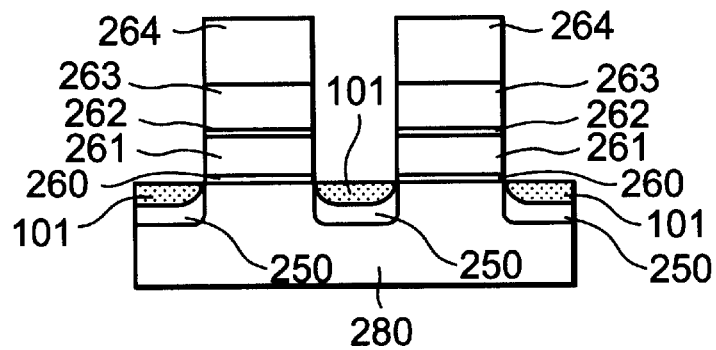

FIG. 3(c) illustrates a sectional view taking along a line CC' of FIG. 3(a). Insulation layers 260 as gate oxide films are formed on a semiconductor substrate 208 selectively. Floating gates 261, correspondingly to the gates 103 of FIG. 3(a), are formed on the respective gate oxide films. Second insulating layers 262 are formed on the respective floating gates 261. Control gates 263, correspondingly to the word lines 104 of FIG. 3(a), are formed to extend over the floating gates 261.

Figure 3D:
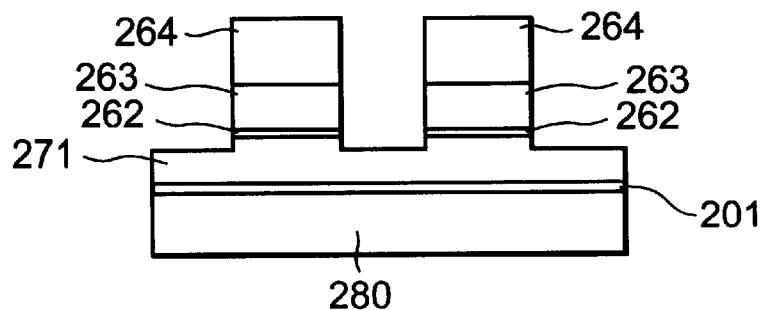

FIG. 3(d) illustrates a sectional view taking in a line DD' of FIG. 3(a). Insulating layers 271, correspondingly to the layers 209 of FIG. (b), are formed on the device isolating regions 201. That is, each of the insulating layers 271 extends in a direction perpendicular to the word lines. Therefore, an insulating layer 271 exists between the adjacent floating gates under one word line to be in contact with the adjacent floating gates.

Next, a method of manufacturing the memory will be explained below, with reference to process cross sections, in FIGS. 4(a) to 4(e), along a line BB' in FIG. 3(a). The regions on which tunnel oxide layers 203 are formed as shown in FIGS. 4(a) to 4(e) correspond to the diffused layers 101 in FIG. 3(a). The regions where device isolating oxide layers 201 are formed, as in FIGS. 4(a) to 4(e), correspond to the regions of the device isolating oxide layers 102 in FIG. 3(a). Floating gates 204 in FIGS. 4(a) to 4(e) correspond to the floating gates 103 in FIG. 3(a).

In FIG. 4 (a), device isolating layers 201 are formed on predetermined places, at least, in a cell region. A layer of floating gate material (polysilicon layer 202) is deposited next, all over the substrate. The device isolating layers 201 are made of a material such as a silicon oxide. A conductive semiconductor material or a metal material, which has a high conductivity, specifically polysilicon, Aluminum (Al), titanium nitride (TiN), or Copper (Cu) is used for the floating electrode material.

Either the entire layer of floating electrode material 202, deposited on the device isolating layers 201 or a part of it, is removed next by etching in order to form ditches. Thereby, the layer of floating electrode material 202 is patterned in a predetermined manner, to form floating gates 204 in the cell region (see FIG. 4 (b)). In FIG. 4 (b), the floating gates 204 extend to and exist on the device isolating oxide layers 201.

Next, to fill the ditches, the first insulation layer is formed all over the cell region at least. A silicon oxide layer or a silicon nitride layer or other related material layers is preferable, as the first insulation layer. The utilization of such material prevents an etching of the device isolating oxide layers 201, which will be caused in a subsequent process step. In addition, to fill the ditches, especially to fill ditches, which are narrow, utilization of a high performance layer formation method of filling ditches or holes is preferable. For example, utilization of the plasma CVD (Chemical Vapor Deposit) method, especially the high density plasma CVD method, is preferable. Wherein a gas such as monosilane or tetraethoxysilane (TEOS) is used, as the necessary source gas in this method. Each predetermined part of the first insulation layer is removed next, by dry-etching or the CMP (chemical mechanical Polishing) method. As a result, the layer of floating electrode material is exposed. Thereafter, the ditches are filled in, on top of the device isolating oxide layers 201 with insulation layers 205 (see FIG. 4(c)).

A second insulation layer 206 is formed next, all over the cell region at least. A silicon oxide layer, a silicon nitride layer, or other related material layers are utilized for the material, which makes up the second insulation layer 206. Alternatively, multiple layers of them can also be utilized. To simplify the manufacturing process steps, the second insulation layer 206, or the bottom layer of the multiple layers, can be of the same material as that of the above-mentioned insulation layers 205. Thereafter, layers, made of electrode materials, are deposited on the surface (see FIG. 4(d)). In this embodiment, a polysilicon layer 207 and a silicide layer 208 are deposited. To improve the conductivity of the polysilicon layer 207, an impurity such as phosphorous (P) is, preferably, implanted in the layer 207. It is noted that these electrode material layers 207 and 208 can be deposited over a peripheral region, as well as the cell region of the memory, at the same time. The structure shown in FIG. 4(d) is the same to a cross sectional view taking along a word line shown in FIG. 3(a). That is, the insulation layers 205 exists on the respective device isolating region 201 between the adjacent floating gates 204 under one word line.

The second insulation layer 206 and the electrode material layers 207 and 208 are all dry-etched, to form control electrodes in the cell region (not shown in the Figures). The control electrodes correspond to the word lines 104 in FIG. 3(a). It is noted that no control electrode is formed along the cross section along the line B B' in FIG. 3(a), but a structure as shown in FIG. 4(e) is formed. As shown in FIG. 4(e), insulation layers 209 (the remains which have resulted from the etching of the insulation layer 206, the layers of floating gate material 204, and the insulation layers 205) are left on the respective device isolating oxide layers 201. Therefore, no concave area is formed on the device isolating oxide layers 201. This result is different from that of the conventional techniques, where concave areas are formed in the manner shown in FIG. 2(d). This enables providing a memory with enhanced device isolating characteristics according to the present invention. In addition, this prevents the possible generation of a channel right under the device isolating oxide layers.

A memory and the manufacturing method thereof, according to a second embodiment of the present invention, will be explained below in detail by giving more specific information on its configuration, with reference to FIGS. 3(d) and FIGS. 4(a) to 4(e).

Since the configuration in FIGS. 3(a) to 3(d) has been already described above, its explanation will be omitted here. And since the relationship between the elements in FIGS. 3(a) to 3(d) and those in FIGS. 4(a) to 4(e) is also the same as described in the first embodiment, its explanation is also omitted here.

Hereafter, a detailed manufacturing process will be described in reference to FIGS. 4(a) to 4(e). Firstly, device isolating oxide layers (silicon oxide layers), each having a thickness, ranging from 400 nm to 500 nm, are formed on a semiconductor substrate by utilizing the LOCOS method or other related methods. Tunnel oxide layers 203, each having a thickness of 10 nm or less, are formed next in a device region. A polysilicon layer 202 is deposited next all over the surface (see FIG. 4(a)). The polysilicon layer 202 is used to become floating gates in a subsequent process step. Phosphorous implant is generally implanted in the polysilicon layer 202, which has a thickness of approximately 150 nm.

Figure 4A:
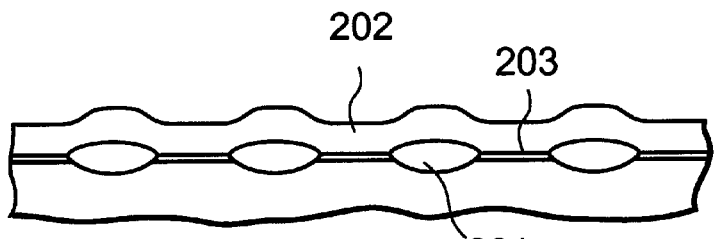
FIGS. 4(a) and 4(e) illustrate process cross-sections, showing a flash memory manufacturing method and the configuration of a flush memory, according to the present invention.
Figure 4B:
Figure 4C:
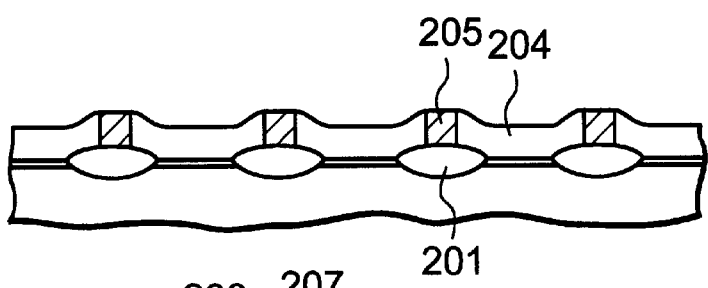
Figure 4D:
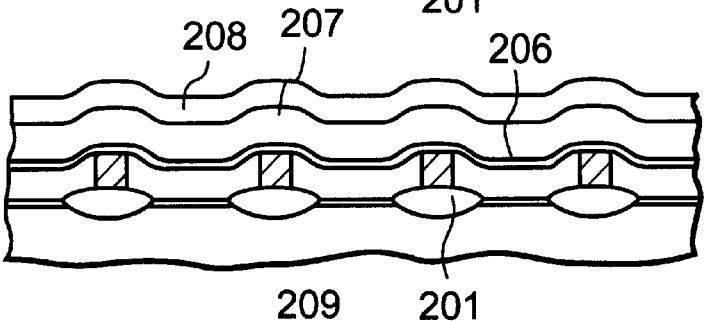
Figure 4E:
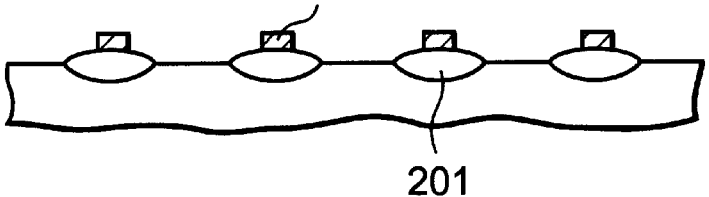

In FIG. 4(b), a photo resist (not shown in the Figure) is patterned next, in an ordinary step of the photo-lithography process. The polysilicon layer 202 is then etched, to form floating gates 204.

Thereafter, an insulation layer, such as a silicon oxide layer or a silicon nitride layer, having a thickness of 150 nm, is deposited by using the CVD (Chemical Vapor Deposit) method. The insulation layer 206 deposited on the polysilicon layers 204, are removed next, by using the etching-back method or the CMP method. This allows the filling of the ditches, located between adjacent floating gates 204, which are deposited on the respective device isolating oxide layers 201, with insulation layers 205 (FIG. 4(c)).

An insulation layer 206 is deposited next, all over the surface. The insulation layer 26w ill become an insulation layer, which insulates the floating gates 204 from control gates, which will be formed later. The insulation layer 206 has, for example, a multiple layered structure, made up of a silicon oxide layer, a silicon nitride layer, and a silicon oxide layer. Wherein the structure has a thickness of 18 nm or less, if it is converted into that of the oxide layer. A polysilicon layer 207, which has been implanted with a phosphorous implant, and a silicide layer 208 are deposited next, in the order, as written above (see FIG. 4(d). Each of the layers is approximately 150 nm in thickness. The polysilicon layer 207 and the silicide layer 208 will become the gate electrodes in transistors in the region of a peripheral circuit and also serve as the control gates in transistors in the cell region, at the same time.

A cell gate etching is performed next. It is noted that no cell gate is formed in the region as shown in FIGS. 4(a) to 4(e) since the region is the one along the line B–B' in FIG. 3.

In the above step of cell gate etching, the polysilicon layer 207 and the silicide layer 208 are first removed by etching them in the order, as written above. The insulation layer 206 is removed next. The insulation layers 205, buried in the ditches between the adjacent floating gates 204, are etched to the extent where the insulation layer 206 is over-etched. However, the insulation layer 206 is not etched to any great extent, when the polysilicon layers 204 are etched. This emanates from the fact, that the etching selectivity of the polysilicon layers 204 to the insulation layer 206 is high. Therefore, after the completion of the cell gate etching, small amounts of insulation layers 209 etched, are left on the device isolating oxide layers 201, as shown in FIG. 4(e).

Source regions and drain regions (not shown in the figure) are formed next in the cell region, and gate regions are formed in the region of the peripheral circuits. Source regions and drain regions in transistors are formed next in the region of the peripheral circuit. A flash memory is completed next, by subjecting itself to an interlayer insulating layer process (interlayer insulating layer are formed on at least control gates, insulating layers 209 and device isolating region 201(not shown in figures)), a contact process step and an interconnecting process step.

By utilizing the above process steps of manufacturing the flash memory, according to the present invention, possible losses of the device isolating oxide layers, caused by the cell gate etching process, are prevented from occurring, forming complete device isolating oxide layers. Therefore, an advanced non-volatile semiconductor memory with high device isolating characteristics, according to the present invention, can be provided.

Furthermore, the configuration of the combination of residual insulation layers 209 and the device isolating layers 201 as shown in FIG. 4(e), is important for an improvement of the device isolating characteristics in the flash memory.

According to a non-volatile semiconductor memory manufacturing method and the configuration of a non-volatile semiconductor memory, according to the present invention, ditches, between adjacent floating gates of the non-volatile semiconductor memory, are filled with insulation layers, so an occurrence of possible losses of the device isolating oxide layers (concave areas as shown in FIG. 2(d)), caused by a cell gate etching process, are prevented and the device isolating characteristics are improved.

The configuration and its manufacturing method, described up to this point, are of a flash memory, which is one type of the non-volatile semiconductor memory, according to the present invention. However, the present invention is not limited to the flash memory as described above. It also includes other types of EEPROM (Electrically Erasable Programmable Read-only Memory) and the ultraviolet erasable PROM.

Moreover, since the insulation layers 205 are formed in cavities between the adjacent floating gates under a word line, there is not occurrence of break down of the word line at the space between the adjacent floating gates.

While the present invention has been described, in connection with certain preferred embodiments, it is to be understood that the subject matter, encompassed by the present invention, is not limited to those specific embodiments. On the contrary, it is intended to include all alternatives, modifications, and equivalents as can be included within the spirit and scope of the following claims.

What is claimed is:

1. A non-volatile semiconductor memory device comprising:
   a plurality of memory cells, each of said memory cells including a control gate, a floating gate and an insulating film formed said control gate and said floating gate;
   a plurality of element isolating layers selectively formed on a semiconductor substrate and arranged to isolate said memory cells from one another; and
   a plurality of insulation layers each formed on a corresponding one of said element isolating layers, each of said insulation layers being different from said insulating film.

2. The non-volatile semiconductor memory device, according to claim 1, wherein said element isolating layers and said insulation layers are arranged in a stripe manner.

3. The non-volatile semiconductor memory device, according to claim 1, wherein the plurality of insulation layers are made of a silicon oxide.

4. The non-volatile semiconductor memory device, according to claim 1, wherein the plurality of insulation layers are made of a silicon nitride.

5. The non-volatile semiconductor memory device, according to claim 1, wherein the plurality of element isolating layers and the plurality of insulation layers are formed in a cell region.

6. A method of forming a non-volatile semiconductor memory device, comprising:
   forming a plurality of element isolating layers on a semiconductor substrate;
   forming a layer for floating electrode material over said semiconductor substrate and said element isolating layers;
   selectively removing said layer of floating electrode material to form a plurality of ditches, each ditch exposing a part of a corresponding one of said element isolation layers; and
   filling said ditches with insulating layers to cover said part.

7. The method according to claim 6, wherein the layer of floating electrode material is made of polysilicon.

8. The method according to claim 6, wherein the plurality of insulation layers are made of a silicon oxide.

9. The method according to claim 6, wherein the plurality of insulation layers are made of a silicon nitride.

10. A method of forming a semiconductor device, comprising:
    forming at least one element isolating region on a semiconductor substrate;
    forming a first insulating film on said semiconductor substrate at one side of said element isolating region;
    forming a second insulating film on said semiconductor substrate at the other side of said element isolating region;
    forming a first conductive film on said first insulating film;
    forming a second conductive film on said second insulating film, said second conductive film apart from said first conductive film to form at least one cavity which exposes a top surface of said element isolating region;
    forming at lest one second insulating film in said cavity;
    forming a third insulating film on said first and second conductive films and said second insulating film;
    forming a second conductive film on said third insulating film;
    removing said second conductive film;
    over etching said third insulating film, thereby etching a top of said second insulating film, resulting in forming a remaining conductive layer on said element isolating region; and
    removing said first and second conductive films.

11. The method as claimed in claim 10, wherein
    said second insulating film is formed to have a first portion, a second portion, and a third portion between said first and second portions, each of said first and second conductive films being coupled to said first, second and third portions of said second insulating film;
    when said second conductive film is removed, said second conductive film is removed selectively to form a first word line extending over said first portion of said second insulating film and a second word line extending over said second portion of said second insulating film, said first word line apart from said second word line;
    when said first conductive film is removed, said first conductive film is removed selectively to form a first floating gate in contact with said first portion of said second insulating film, and to form a second floating gate in contact with said second portion of said second insulating, said first floating gate apart from said second floating gate;
    when said second conductive film is removed, said second conductive film is removed selectively to form a third floating gate in contact with said first portion of said second insulating film, and to form a fourth floating gate in contact with said second portion of said second insulating film, said third floating gate apart from said fourth floating gate.

12. The method as claimed in claim 11, wherein said element isolating region is formed to extend in a first direction; said second insulating film extends in the same direction with said element isolating region; said first word line extends in a second direction perpendicular to said first direction; said second word line extends in said second direction; and each of said first, second, third and fourth floating gates extends in said second direction.

13. A method of forming a semiconductor device comprising:
    forming a plurality of first conductive layers running over a semiconductor substrate and spaced apart from each other by a distance;
    filling the distance with an insulation material;
    covering said first conductive layers and said insulating material with an insulation layer; and
    forming a second conductive layer over said insulating layer;
    wherein each of said first conductive layers runs in a first direction and said second conductive layer runs in a second direction crossing said first direction.

14. The method as claimed in claim 13, further comprising:
    selectively removing each of said first conductive layers by using said second layer and said insulating material as a mask to provide floating gates which are overlapped with said second conductive layers serving as a control gate.

* * * * *